(12) United States Patent
Hembree et al.

(10) Patent No.: US 6,600,334 B1
(45) Date of Patent: Jul. 29, 2003

(54) FORCE APPLYING PROBE CARD AND TEST SYSTEM FOR SEMICONDUCTOR WAFERS

(75) Inventors: David R. Hembree, Boise, ID (US); Warren M. Farnworth, Nampa, ID (US); James M. Wark, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 09/596,272

(22) Filed: Jun. 16, 2000

Related U.S. Application Data

(63) Continuation of application No. 09/001,409, filed on Dec. 31, 1997, now Pat. No. 6,078,186.

(51) Int. Cl.[7] .............................................. G01R 31/26
(52) U.S. Cl. ...................................... 324/765; 324/754
(58) Field of Search .............................. 324/754, 755, 324/757, 758, 761, 765; 361/728, 729, 735, 736, 737, 748, 784, 790, 791, 792, 803

(56) References Cited

U.S. PATENT DOCUMENTS

| | | | |
|---|---|---|---|
| 3,866,119 A | | 2/1975 | Aredezzone et al. |
| 4,585,991 A | | 4/1986 | Reid et al. |
| 4,795,977 A | | 1/1989 | Frost et al. |
| 4,891,585 A | | 1/1990 | Janko et al. |
| 5,049,813 A | | 9/1991 | Van Loan et al. |
| 5,172,050 A | | 12/1992 | Swapp |
| 5,177,439 A | | 1/1993 | Liu et al. |
| 5,180,977 A | | 1/1993 | Huff |
| 5,225,037 A | | 7/1993 | Elder et al. |
| 5,424,652 A | | 6/1995 | Hembree et al. |
| 5,517,126 A | | 5/1996 | Yamaguchi |
| 5,521,522 A | | 5/1996 | Abe et al. |
| 5,546,405 A | * | 8/1996 | Golla ........................ 714/724 |
| 5,634,267 A | | 6/1997 | Farnworth et al. |
| 5,678,301 A | | 10/1997 | Gochnour et al. |
| 5,686,317 A | | 11/1997 | Akram et al. |
| 5,703,494 A | | 12/1997 | Sano |
| 5,767,692 A | * | 6/1998 | Antonello et al. .......... 324/761 |
| 5,798,655 A | * | 8/1998 | Kazama et al. ............. 324/761 |
| 5,869,974 A | | 2/1999 | Akram et al. |
| 5,894,161 A | | 4/1999 | Akram et al. |
| 5,915,755 A | | 6/1999 | Gochnour et al. |
| 5,915,977 A | | 6/1999 | Hembree et al. |
| 5,931,685 A | | 8/1999 | Hembree et al. |
| 5,962,921 A | | 10/1999 | Farnworth et al. |
| 6,025,730 A | | 2/2000 | Akram et al. |
| 6,060,891 A | | 5/2000 | Hembree et al. |
| 6,078,186 A | | 6/2000 | Hembree et al. |
| 6,107,109 A | | 8/2000 | Akram et al. |
| 6,114,240 A | | 9/2000 | Akram et al. |

(List continued on next page.)

OTHER PUBLICATIONS

.039 Centers Duraseal Series, size 00, brochure, date unavailable.
Science Over Art. Our New IC Membrane Test Probe, Packard Hughes Interconnect, brochure, 1993 (month unavailable).

*Primary Examiner*—Kamand Cuneo
*Assistant Examiner*—Russell M. Kobert
(74) *Attorney, Agent, or Firm*—Stephen A. Gratton

(57) ABSTRACT

A probe card for testing a semiconductor wafer, a test method, and a test system employing the probe card are provided. The probe card includes: a substrate; an interconnect slidably mounted to the substrate; and a force applying mechanism for biasing contacts on the interconnect into electrical engagement with contacts on the wafer. The force applying mechanism includes spring loaded electrical connectors that provide electrical paths to the interconnect, and generate a biasing force. The biasing force is controlled by selecting a spring constant of the electrical connectors, and an amount of Z-direction overdrive between the probe card and wafer. The probe card also includes a leveling mechanism for leveling the interconnect with respect to the wafer.

21 Claims, 5 Drawing Sheets

U.S. PATENT DOCUMENTS 6,261,854 B1     7/2001    Akram et al.
6,275,052 B1     8/2001    Hembree et al.
6,329,829 B1    12/2001    Farnworth et al.
6,359,456 B1     3/2002    Hembree et al.
6,400,172 B1     6/2002    Akram et al.
6,469,537 B1    10/2002    Akram et al.

\* cited by examiner

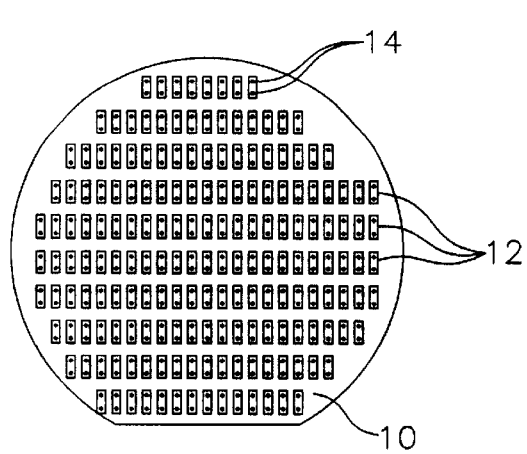
FIGURE 1
(PRIOR ART)
FIGURE 2
(PRIOR ART)
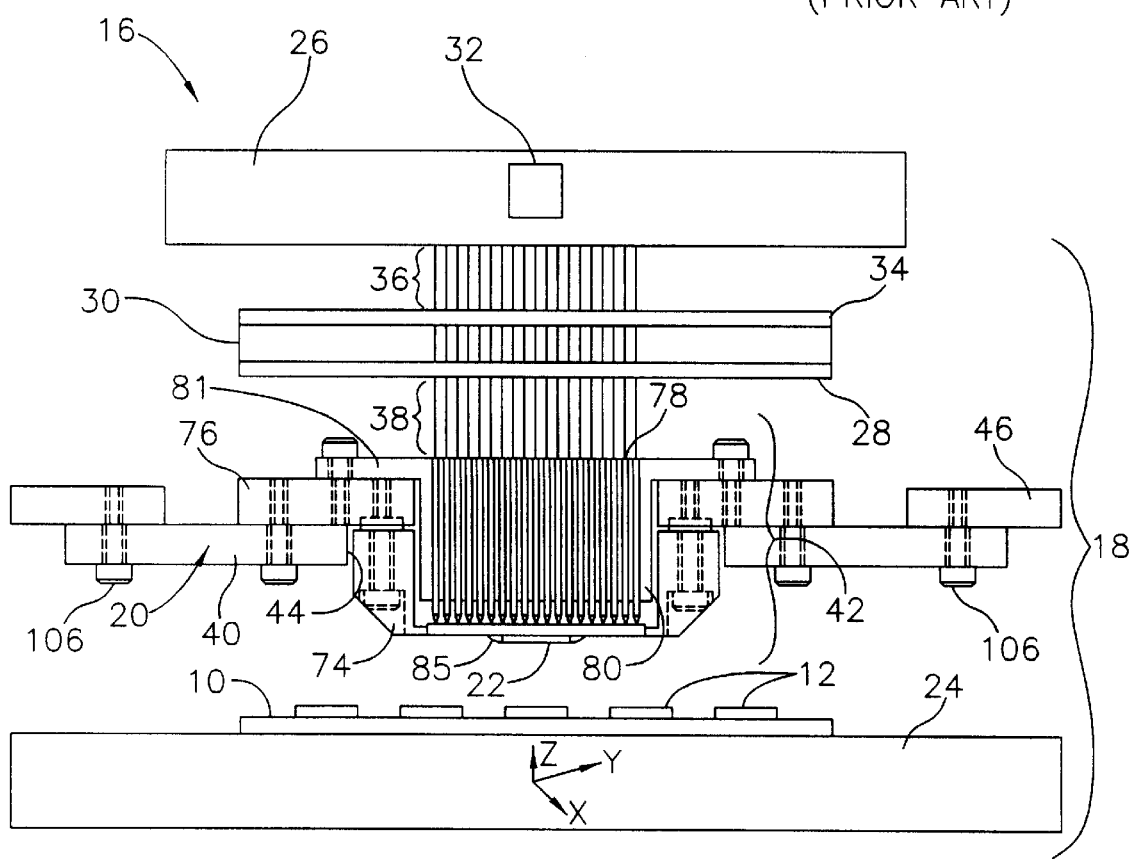
FIGURE 3

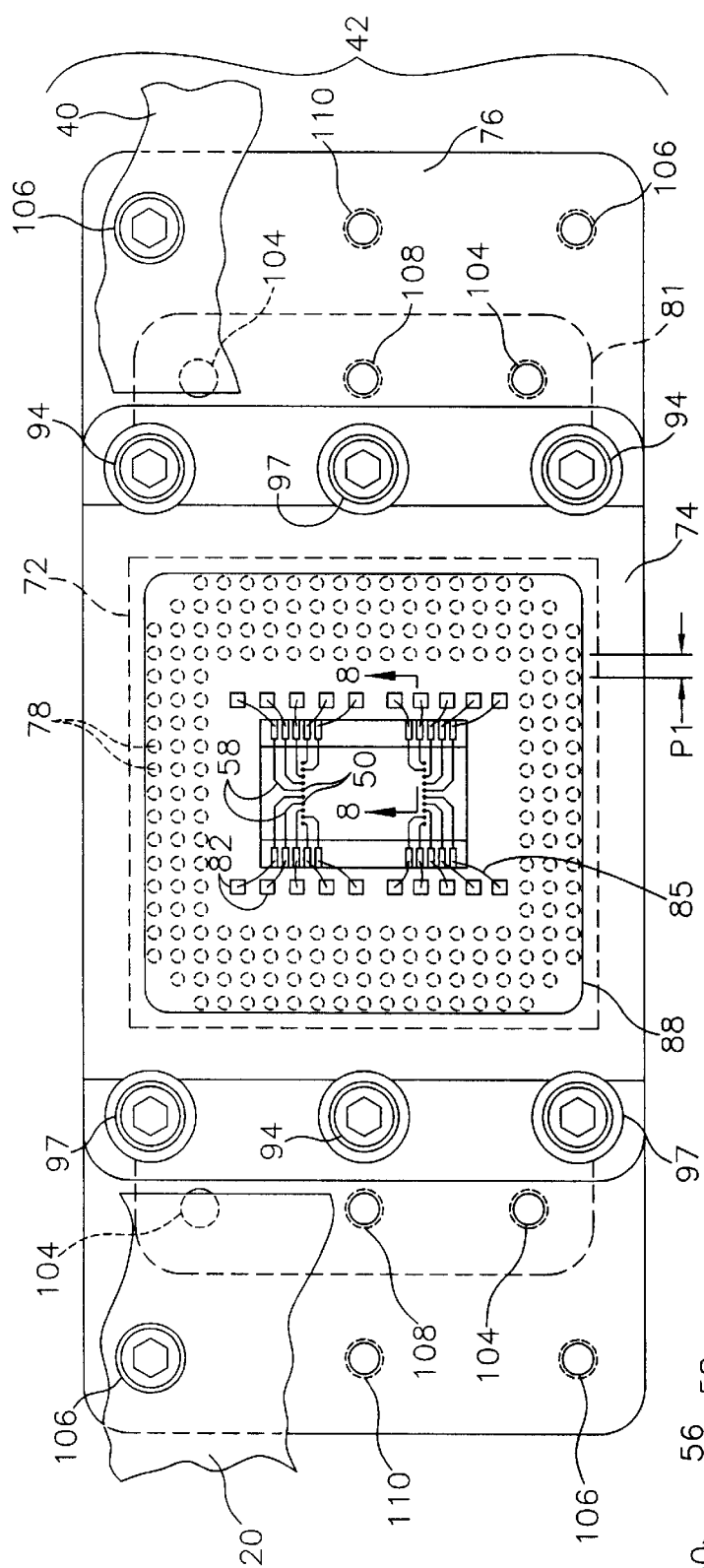
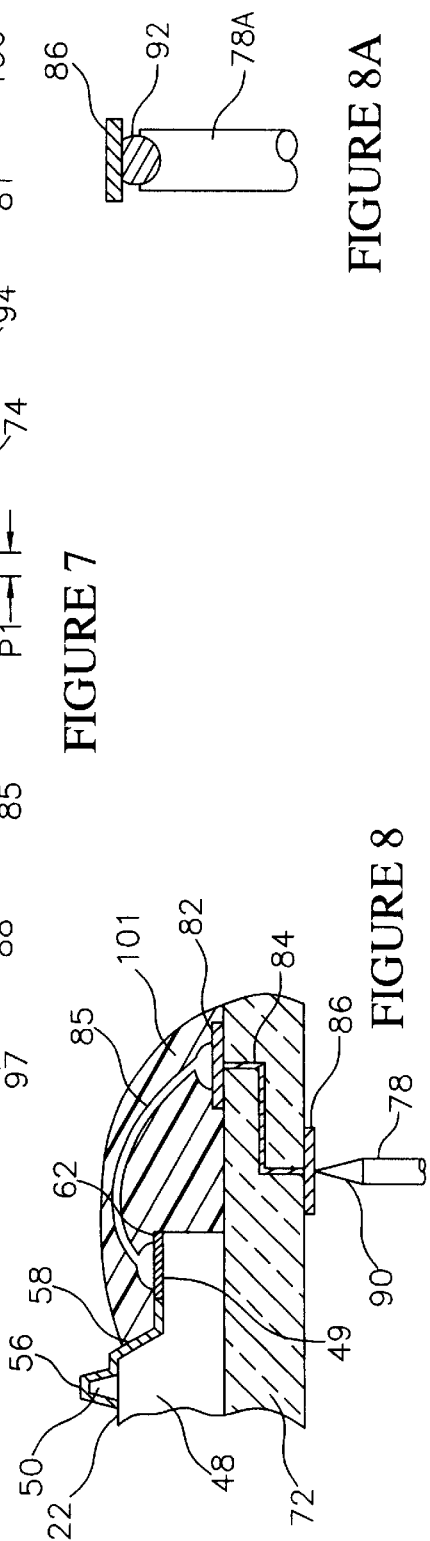
FIGURE 7
FIGURE 8A
FIGURE 8

| PROVIDE WAFER HANDLER 18 AND TESTER 26 FOR APPLYING TEST SIGNALS FOR TESTING SEMICONDUCTOR DICE 12 CONTAINED ON THE WAFER 10. |
|---|

| PROVIDE PROBE CARD 20 FOR THE WAFER HANDLER 18 INCLUDING SLIDABLY MOUNTED INTERCONNECT 22 AND FORCE APPLYING MEMBER 42 WITH SPRING LOADED ELECTRICAL CONNECTORS 78 FOR ELECTRICALLY CONTACTING AND BIASING THE INTERCONNECT 22 AGAINST THE WAFER 10. |
|---|

| LOAD THE WAFER 10 INTO THE WAFER HANDLER 18. |
|---|

| LEVEL THE INTERCONNECT 22 WITH RESPECT TO THE WAFER 10 BY ADJUSTING THE PLANAR ORIENTATION OF THE INTERCONNECT 22 ALIGN DIE CONTACTS 14 ON THE WAFER 10 WITH INTERCONNECT CONTACTS 50 BY MOVING THE WAFER 10 OR THE PROBE CARD 20 IN X AND Y DIRECTIONS. |
|---|

| MOVE THE WAFER 10 OR THE PROBE CARD 20 IN THE Z-DIRECTION TO PLACE THE DIE CONTACTS 14 AND THE INTERCONNECT CONTACTS 50 IN PHYSICAL CONTACT. |
|---|

| OVERDRIVE THE WAFER 10 OR THE PROBE CARD 20 IN THE Z-DIRECTION BY A SELECTED DISTANCE SO THAT THE INTERCONNECT CONTACTS 50 PENETRATE THE DIE CONTACTS 14 UNDER BIASING FROM THE SPRING LOADED ELECTRICAL CONNECTORS 78. |
|---|

| COMPRESS THE SPRING LOADED ELECTRICAL CONNECTORS 78 BY THE SELECTED DISTANCE TO EXERT A DESIRED BIASING FORCE ON THE INTERCONNECT CONTACTS 50 FOR PENETRATING THE DIE CONTACTS 14 TO A LIMITED PENETRATION DEPTH. |
|---|

| TRANSMIT TEST SIGNALS THROUGH INTERCONNECT CONTACTS 50 TO DIE CONTACTS 14. |
|---|

FIGURE 9

FORCE APPLYING PROBE CARD AND TEST SYSTEM FOR SEMICONDUCTOR WAFERS

CROSS REFERENCE TO RELATED APPLICATIONS

This application is a continuation of application Ser. No. 09/001,409 filed on Dec. 31, 1997, U.S. Pat. No. 6,078,186.

FIELD OF THE INVENTION

This invention relates to testing of semiconductor dice contained on a wafer. More particularly, this invention relates to an improved probe card, and to a test method and test system employing the probe card.

BACKGROUND OF THE INVENTION

Semiconductor wafers are tested prior to singulation into individual die, to assess the electrical characteristics of the integrated circuits contained on each die. A typical wafer-level test system includes a wafer handler for handling and positioning the wafers, a tester for generating test signals, a probe card for making temporary electrical connections with the wafer, and a prober interface board for routing signals from the tester pin electronics to the probe card.

The test signals can include specific combinations of voltages and currents transmitted through the pin electronics channels of the tester to the prober interface board, through the probe card, and then to one or more devices under test on the wafer. During the test procedure response signals such as voltage, current and frequency can be analyzed and compared by the tester to required values. The integrated circuits that do not meet specification can be marked or mapped in software. Following testing, defective circuits can be repaired by actuating fuses (or anti-fuses) to inactivate the defective circuitry and substitute redundant circuitry.

One type of probe card includes needle probes for making temporary electrical connections with contacts on the wafer. Typically, these contacts are the bond pads on the individual dice. The probe card typically includes an insulating substrate, such as a glass filled resin. The substrate can include electric traces in electrical communication with the needle probes. In addition, the needle probes can be configured to make electrical connections with a specific die, or groups of dice, on the wafer. Typically, the wafer or the probe card is stepped so that the dice on the wafer are tested in sequence.

One aspect of these testing procedures is that the contacts on the wafer are typically coated with a metal oxide layer. For example, aluminum bond pads can be covered with an aluminum oxide layer that forms by oxidation of the underlying metal. The oxide layer is electrically non conductive, and provides a high degree of electrical resistance to the needle probes. In order to ensure accurate test results, the needle probes must penetrate the oxide layer to the underlying metal.

To penetrate oxide layers on the contacts, the probe card and wafer can be brought together until the needle probes touch the contacts. The probe card can then be overdriven a distance in the Z-direction (e.g., 3 mils) causing the needle probes to bend. As the needle probes bend, their tips move horizontally across the contacts, scrubbing through the oxide layers to the underlying metal. This scrubbing action also displaces some of the underlying metal causing grooves and corresponding ridges to form on the contacts.

This system works satisfactorily when the needle probes are properly adjusted. However, the tips of the needle probes can be misaligned in the Z-direction. Consequently, the needle probes may need to deflect by different amounts to physically engage the contacts on the wafer. The same situation can occur due to differences in the Z-direction location, or planarity, of the contacts on the wafer. If the needle probes cannot flex enough to compensate for Z-direction misalignment in the contacts, then the resultant electrical connections can be poor.

The contact force with which a needle probe presses into a contact, also depends on the amount of deflection in the needle probe. When the needle probes deflect by different amounts, the contact forces are different. This can affect the resistivities of the electrical connections and the test procedure.

Another shortcoming of needle probe cards, is the needle probes cannot be fabricated with a density which permits testing of high pin count devices having dense arrays of bond pads. For example, fabricating needle probes with a pitch of less than 6 mils has been difficult.

Also with needle probe cards, outside electrical connections with the needle probes can be difficult to make. In the past, soldered wires, wire bonds, or bonded polymer film have been used to make the electrical connections to the needle probes. Pin cards are typically required to electrically interface with the probe cards. These components are expensive to manufacture, and make changing and servicing of the probe cards more difficult.

In view of the foregoing, it would be advantageous to provide a probe card which can accurately probe dense arrays of closely spaced contacts on semiconductor wafers. It would also be advantageous to provide a probe card which is relatively simple to construct and maintain, and which can be easily replaced. Still further, it would be advantageous for a probe card to include probe contacts which can move in a Z-direction to accommodate vertical misalignment of contacts on the wafers.

SUMMARY OF THE INVENTION

In accordance with the present invention, an improved probe card for testing semiconductor wafers is provided. Also provided are testing systems, and testing methods employing the probe card. The probe card, simply stated, comprises: a substrate; an interconnect having contacts for making temporary electrical connections with contacts on the wafer; and a force applying mechanism for biasing the interconnect against the wafer with a desired force.

The force applying mechanism includes spring loaded electrical connectors, such as "POGO PINS", which provide electrical paths to the interconnect. The electrical connectors also provide a biasing force for pressing the interconnect contacts against the wafer contacts. The biasing force is dependent on spring constants in spring components of the electrical connectors. The biasing force is also dependent on compression of the spring components resulting from over-driving the wafer in the Z-direction into the probe card.

In an illustrative embodiment, the interconnect comprises silicon, and the interconnect contacts comprise raised members having projections configured to penetrate the contacts on the wafer to a limited penetration depth. In alternate embodiments, the interconnect contacts comprise microbumps on a polymer film, or indentations configured to retain and electrically engage bumped contacts on the wafer.

In each of the embodiments, the interconnect is mounted to an interposer having a dense array of external contacts for engaging the spring loaded electrical connectors. The interposer slidably mounts to a mounting plate which attaches to the probe card substrate. The planar orientation of the mounting plate is adjustable to allow the interposer and interconnect to be leveled with respect to the wafer prior to a test procedure.

A test system constructed in accordance with the invention includes the probe card mounted to a conventional wafer handler. The wafer handler is adapted to align the contacts on the probe card to the contacts on the wafer, and to bring the wafer and probe card together with a desired amount of Z-direction overdrive. The test system also includes a tester having test circuitry in electrical communication with the interconnect contacts. The tester is adapted to transmit test signals through the interconnect contacts to the dice contained on the wafer, and to analyze resultant test signals.

BRIEF DESCRIPTION OF THE DRAWINGS

FIG. 1 is a plan view of a prior art semiconductor wafer containing multiple semiconductor dice;

FIG. 2 is a plan view of a prior art semiconductor die illustrating contacts on an individual die on the wafer;

FIG. 3 is a schematic cross sectional view of a test system constructed in accordance with the invention;

FIG. 7 is a bottom view of FIG. 4 illustrating a force applying mechanism of the probe card;

FIG. 8 is an enlarged schematic cross sectional view taken along section line 8—8 of FIG. 7; FIG. 8A is an enlarged schematic cross sectional view of an alternate embodiment electrical connector configured to engage a ball contact; and FIG. 9 is a block diagram of steps in a testing method performed in accordance with the invention.

DETAILED DESCRIPTION OF THE PREFERRED EMBODIMENT

Figure 4:
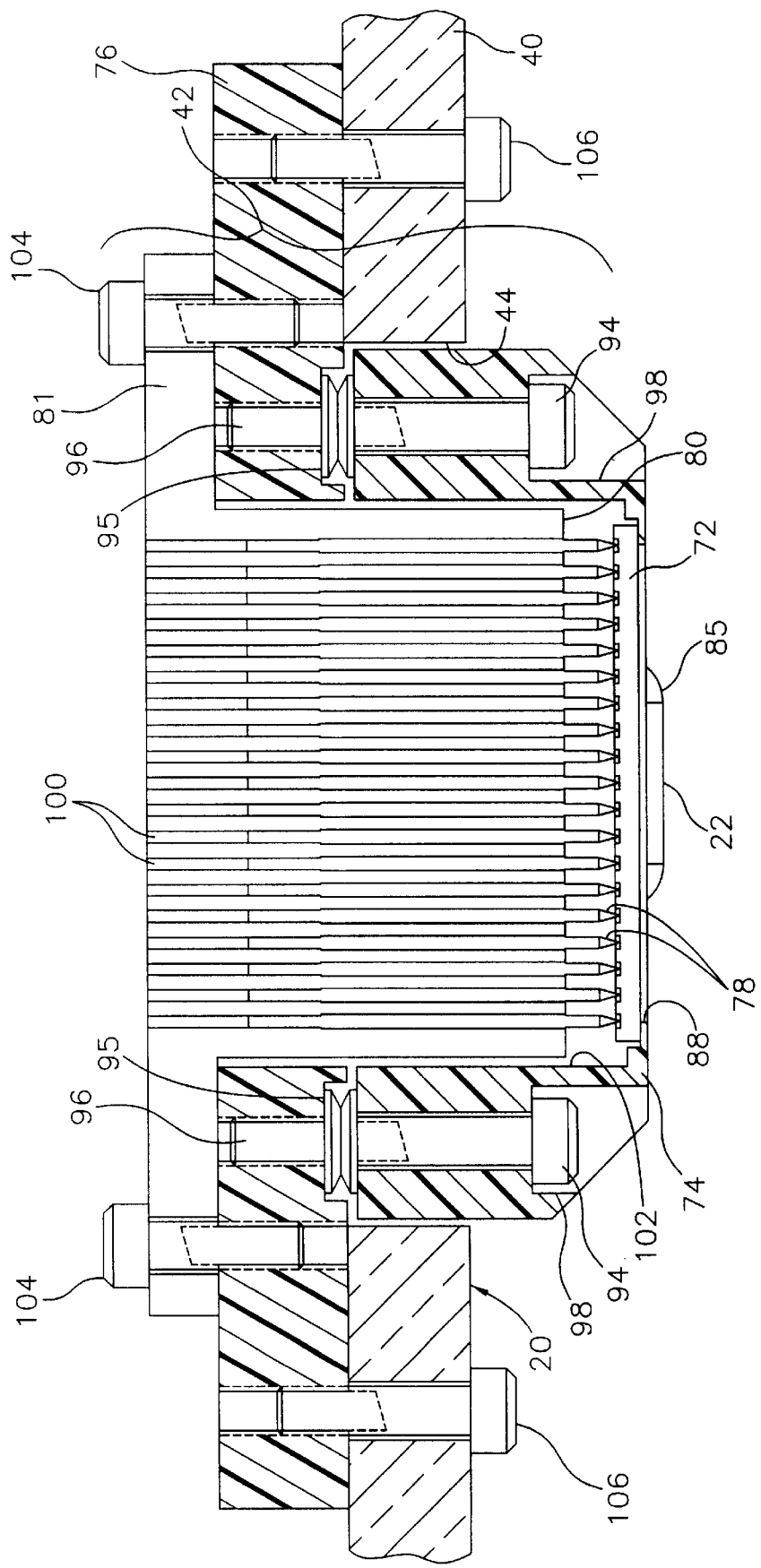
FIG. 4 is an enlarged schematic cross sectional view of a probe card constructed in accordance with the invention.

Referring to FIGS. 1 and 2, a prior art semiconductor wafer 10 includes multiple semiconductor dice 12 fabricated using processes that are well known in the art. As shown in FIG. 2, each die 12 includes multiple die contacts 14. The die contacts 14 comprise bond pads in electrical communication with integrated circuits contained on the die 12. For illustrative purposes, each die 12 includes twenty eight die contacts 14. However, as is apparent, this number of die contacts 14 is merely exemplary. In addition, although the die contacts 14 are illustrated as bond pads, they can also be dedicated test pads, or fuse pads, located on the dice 12, or on other portions of the wafer 10.

Referring to FIG. 3, a test system 16 constructed in accordance with the invention is shown. The test system 16 is configured to test the dice 12 contained on the wafer 10.

The test system 16 includes a probe card 20 comprising an interconnect 22 for making temporary electrical connections with the die contacts 14. The test system 16 also includes a wafer handler 18, and a tester 26 having test circuitry 32 for applying test signals through the interconnect 22 to the die contacts 14, and for analyzing the resultant signals.

The wafer handler 18 interfaces with a test head 30 wherein the probe card 20 is mounted. In addition, the wafer handler 18 includes a wafer chuck 24 configured to move in X and Y directions to align the wafer 10 with the probe card 20, and in the Z direction to move the wafer 10 into contact with the probe card 20. The wafer handler 18 can also include an optical or mechanical alignment system (not shown) for aligning the wafer 10 to the probe card 20. One suitable wafer handler 18 is manufactured by Electroglass and is designated a Model 4080.

The test system 16 also includes a prober interface board 28 for routing test signals from the tester 26 to the test head 30 to the probe card 20. The prober interface board 28 can be mounted to the test head 30. In addition, the prober interface board 28 can be in electrical communication with tester pin electronics 34 in the test head. Separate electrical paths 36 are provided from test circuitry 32 in the tester 26 to the tester pin electronics 34, and to the prober interface board 28. The prober interface board 28 includes separate electrical paths 38 to the probe card 20.

Referring to FIG. 4, the probe card 20 is illustrated separately in an enlarged view. The probe card 20, generally stated, comprises: a probe card substrate 40, the interconnect 22, and a force applying mechanism 42.

The probe card substrate 40 preferably comprises an electrically insulating material such as a glass filled resin (e.g., FR-4), a ceramic or a plastic. The probe card substrate 40 includes an opening 44 wherein the force applying mechanism 42 is mounted. Viewed from above, the opening 44 is generally rectangular shaped to accommodate a mating rectangular shape of the force applying mechanism 42. However, as is apparent, a rectangular shape is merely exemplary.

The probe card substrate 40 can be attached to a probe card fixture 46 (FIG. 3) mounted within the test head 30 (FIG. 3). Threaded fasteners 106 (FIG. 3) can be used to removably attach the probe card substrate 40 to the probe card fixture 46 (FIG. 3). If desired, the probe card substrate 40 can be a conventional probe card having the middle portion removed to form the opening 44. The probe card fixture 46 can also be a conventional component. Conventional probe cards and probe card fixtures are available from Packard Hughes Interconnect, Los Angeles, Calif., and Wentworth Laboratories, Sunnyvale, Calif.

Figure 5:
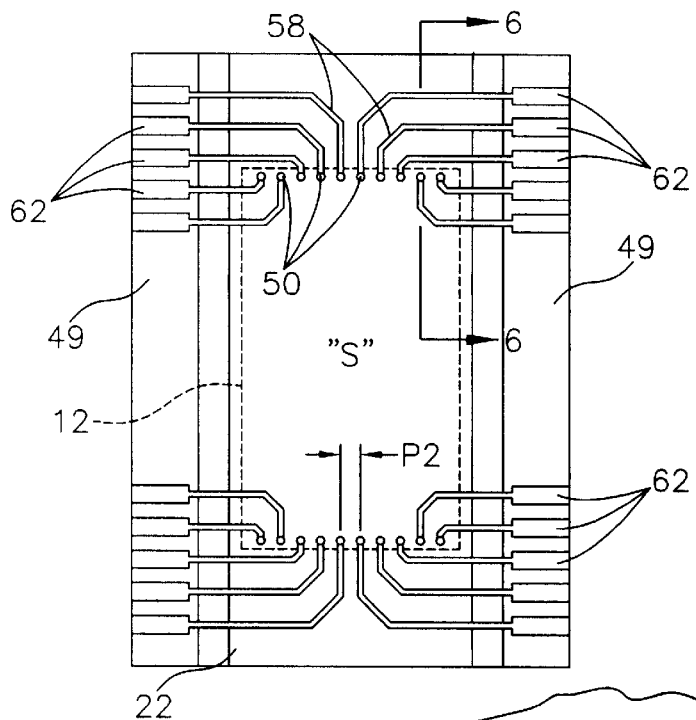
FIG. 5 is an enlarged view taken of a portion of FIG. 4 illustrating an interconnect of the probe card.
Figure 6:
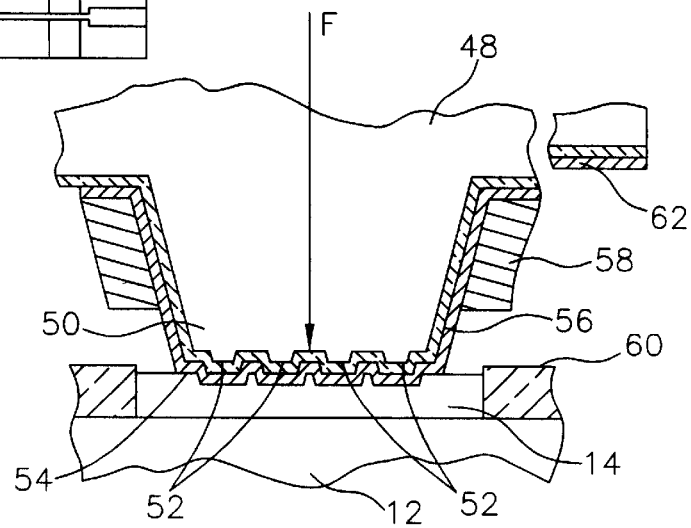
FIG. 6 is an enlarged cross sectional view taken along section line 6—6 of FIG. 5 illustrating a contact on the interconnect electrically engaging a contact on the wafer.

Referring to FIGS. 5 and 6, the interconnect 22 of the probe card 20 is illustrated separately. The interconnect includes an interconnect substrate 48 and one or more patterns of interconnect contacts 50. The interconnect contacts 50 are arranged in patterns corresponding to the patterns of the die contacts 14. Each pattern of interconnect contacts 50 represents a single test site (S). For simplicity, only one test site (S) is illustrated. However, in actual practice the interconnect 22 can include multiple patterns of interconnect contacts 50 forming multiple test sites to accommodate testing of multiple dice 12 at the same time.

As shown in FIG. 6, the interconnect contacts 50 can be formed as raised members that project from a surface of the interconnect substrate 48. The raised interconnect contacts 50 help to provide a separation distance between the interconnect 22 and the wafer 10, to clear any particulate contaminants that may be present on the opposing surfaces.

In addition, the interconnect contacts 50 can include penetrating projections 52 adapted to penetrate the die contacts 14 to a limited penetration depth. In particular, the penetrating projections 50 have a height that is less than a thickness of the die contacts 14. For thin film aluminum bond pads, this thickness will typically be less than 2.0 μm. As also shown in FIG. 6, surfaces 54 at the tips of the interconnect contacts 50 provide stop planes for limiting penetration of the interconnect contacts 50 into the die contacts 14. These stop plane surfaces 54 along with the dimensions of the penetrating projections 52 insures that the interconnect contacts 50 minimally damage the die contacts 14 during a test procedure. Also during a test procedure, the interconnect contacts 50 and die contacts 14 are aligned using optical alignment or other techniques, such that the passivation layer 60 is not touched by the interconnect contacts 50.

The interconnect contacts 50 and penetrating projections 52 can be formed integrally with the interconnect substrate 48 using a semiconductor fabrication process such as bulk micromachining. Such a process permits the interconnect contacts 50, and penetrating projections 52, to be formed accurately in a dense array.

Each interconnect contact 50 is covered with a conductive layer 56 in electrical communication with a conductor 58. The conductors 58 include bonding pads 62 for wire bonding or otherwise forming separate electrical paths to the interconnect contacts 50. In addition, the interconnect substrate 48 can optionally include recessed bonding shelves 49 (FIG. 5) along either side wherein the bonding pads 62 are located.

The conductive layers 56 for all of the contacts 50 can be formed of a metal layer deposited and patterned to cover the interconnect contacts 50, or other selected areas of the substrate 48. By way of example, the conductive layers 56 for the interconnect contacts 50 can be formed of aluminum, copper, titanium, tungsten, tantalum, platinum, molybdenum, cobalt, nickel, gold, iridium or alloys of these metals. Some of these materials such as gold and platinum are non-reactive so that material transfer between the interconnect contacts 50 and die contacts 14 can be minimized. The conductive layers 56 can also be a metal silicide or a conductive material such as polysilicon. In addition, the conductive layers 56 can be formed as a bi-metal stack comprising a base layer and a non-reactive and oxidation resistant outer layer, such as gold or platinum.

The conductive layers 56 can be formed using a metallization process comprising deposition (e.g., CVD), followed by photo patterning and etching. The conductive layer 56 for each interconnect contact 50 is in electrical communication with a corresponding conductor 58 formed on the interconnect substrate 48. The conductive layers 56 and conductors 58 can be formed at the same time using the same metallization process. Alternately, the conductive layers 56 can be formed of a different metal than the conductors 58 using separate metallization process. The bonding pads 62 for the conductors 58 preferably comprise a wire bondable metal such as gold or palladium. A process for fabricating the interconnect contacts 50 is described in U.S. Pat. No. 5,686,317 entitled "Method For Forming An Interconnect Having A Penetration Limited Contact Structure For Establishing A Temporary Electrical Connection With A Semiconductor Die", which is incorporated herein by reference.

Figures 6A, 6B:
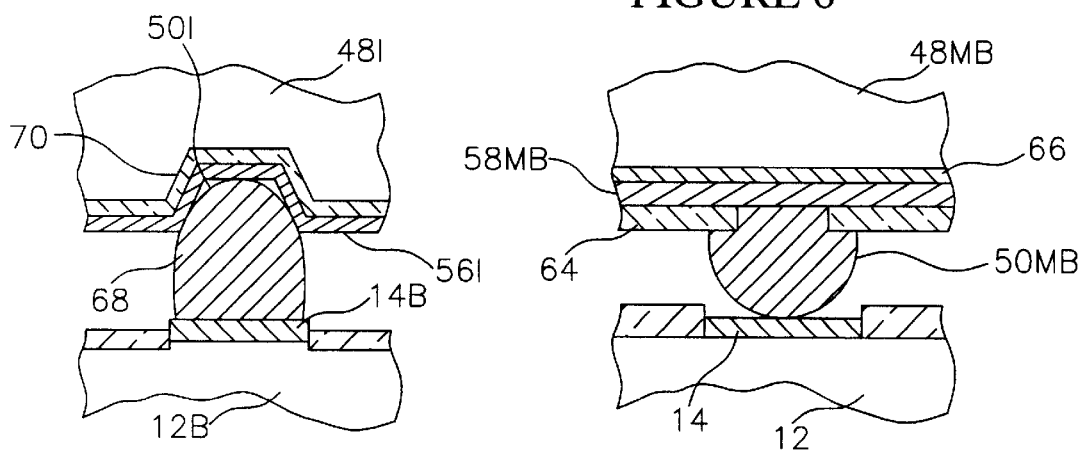
FIG. 6A is an enlarged cross sectional view equivalent to FIG. 6 illustrating an alternate embodiment microbump contact.
FIG. 6B is an enlarged cross sectional view equivalent to FIG. 6 illustrating an alternate embodiment indentation contact for electrically engaging a bumped contact on a bumped die.

Referring to FIG. 6A, an alternate embodiment microbump contact 50MB comprises a metal ball formed on a polymer film 64. The polymer film 64 comprises a flexible polymer such as polyimide, onto which patterns of conductors 58MB are formed. Preferably the conductors 58MB are formed on one side of the polymer film 64 and the microbump contacts 50MB are formed in metal filled vias formed through the polymer film 64 to the conductors 58MB. This type of polymer film 64 is sometimes referred to as "flex circuit". One suitable polymer film is manufactured by Nitto Denko under the trademark "ASMAT". A compliant adhesive layer 66 attaches the polymer film 64 to a substrate 48MB. Further details of a contact similar to microbump contact 50MB are described in U.S. Pat. No. 5,678,301, entitled "Method For Forming An Interconnect For Testing Unpackaged Semiconductor Dice", which is incorporated herein by reference.

Referring to FIG. 6B, an alternate embodiment interconnect contact 50I is shown. In this embodiment, the interconnect contact 50I is configured to electrically engage die contacts 14B having solder bumps 68 formed thereon. The interconnect contact 50I allows bumped dice 12B on the wafer 10 to be tested. The interconnect contact 50I comprises an indentation formed in a substrate 48I and configured to retain the solder bumps 68 on the dice 12B. The substrate 48I can comprise silicon, gallium arsenide or ceramic. The indentation can be etched or machined in the substrate 48I with a required size and shape and then covered with a conductive layer 56I. The conductive layer 56I for the interconnect contact 50I is in electrical communication with a conductor (not shown) equivalent to the conductors 58 (FIG. 5) previously described. Further details of interconnect contact 50I, as well as other contacts for bumped dice are described in U.S. patent application Ser. No. 08/829,193 now U.S. Pat No. 5,962,921, entitled "Interconnect Having Recessed Contact Members With Penetrating Blades For Testing Semiconductor Dice And Packages With Contact Bumps", and in U.S. patent application Ser. No. 08/867,551 now U.S. Pat. No. 5,931,685, entitled "Interconnect For Making Temporary Electrical Connections With Bumped Semiconductor Components", which are incorporated herein by reference.

Referring to FIGS. 4, 7 and 8, the force applying mechanism 42 of the probe card 20 is shown. The force applying mechanism 42 includes an interposer 72 on which the interconnect 22 is mounted. The force applying mechanism 42 also include a base 76 which attaches to the probe card substrate 40 (FIG. 4), and an interposer support plate 74 attached to the base 76.

In addition, the force applying mechanism 42 includes a plurality of spring loaded electrical connectors 78 mounted to a pin mounting plate 80 attached to the base 76. The electrical connectors 78 physically and electrically engage the interposer 72. The electrical connectors 78 can be commercially available spring loaded electrical connectors, such as "POGO PINS" manufactured by Pogo Industries of Kansas City, Kans. Other suitable spring loaded electrical connectors include "DURASEAL" connectors manufactured by IDI, Kansas City, Kans. Optionally, the electrical connectors 78 can be co-axial type connectors wherein an insulating material such as "TEFLON" encompasses portions of the connectors 78 to inhibit cross talk. The pin mounting plate 80 can also be formed of a metal to inhibit cross talk.

As clearly shown in FIG. 8, the interposer 72 includes bonding pads 82 corresponding to the bonding pads 62 on the interconnect 22. Wires 85 are bonded to the bonding pads 82 on the interposer 72, and to the bonding pads 62 on the interconnect 22. The wires 85 can be bonded to the bonding pads 82, 62 using a conventional wire bonder apparatus. The bonding shelf 49 on the interconnect 22 provides additional clearance for the wires 85, such that the interconnect contacts 50 are able to electrically engage the die contacts 14 without interference. The wires 85 provide separate electrical paths between the interconnect 22 and interposer 72. Alternately, in place of wire bonds these electrical paths can be formed by polymer film, TAB tape, or mechanical electrical connectors.

The interconnect 22 can be attached to the interposer 72 using an adhesive such as silicone. In the illustrative embodiment, the interposer 72 comprises a multi-layered ceramic plate, with internal conductors 84 (FIG. 8), and a dense array of external contacts 86 (FIG. 8) in electrical communication with the bonding pads 82. The interposer 72 can comprise a component of a ceramic semiconductor package (e.g., ceramic base), or a chip scale package (e.g., LGA or BGA substrate). The interposer 72 can also be a glass filled resin such as FR-4, or a polymeric material such as polyimide, BT or PCB.

The external contacts 86 on the interposer 72 can be provided with a pitch P1 (FIG. 7) equal to the pitch of the electrical connectors 78. On the other hand, the interconnect contacts 50 (FIG. 5) can be provided with a pitch P2 (FIG. 5) equal to the pitch of the die contacts 14 (FIG. 2). The pitch P1 of the external contacts 86 must be at least 20 mils to accommodate the size of the electrical connectors 78. However, the pitch P2 of the interconnect contacts 50 can be as small as 2 mils to accommodate small, closely spaced die contacts 14. The interposer 72 thus bridges the size difference between the electrical connectors 78 and the interconnect contacts 50.

In the embodiment of FIG. 8, the external contacts 86 on the interposer 72 comprise land pads in a land grid array (LGA). As shown in FIG. 8, the electrical connectors 78 can include a pointed tip portion 90 for penetrating into the external contacts 86. Alternately as shown in FIG. 8A, the external contacts 86 on the interposer 72 include ball contacts 92, such as solder balls, in a ball grid array (BGA). With ball contacts 92, alternate embodiment electrical connectors 78A can include concave tip portions for engaging the ball contacts 92.

As shown in FIGS. 4 and 7, the interposer support plate 74 includes an opening 88 formed with a peripheral lip for supporting the interposer 72. The interconnect 22 projects through the opening 88. The peripheral lip of the opening 88 prevents the interposer 72 and interconnect 22 from separating from the interposer support plate 74. However, the interposer 72 is movable within the opening 88 in the Z-direction towards the electrical connectors 78. The opening 88 can be sized to prevent excessive movement of the interposer 72 in the X and Y directions. If desired, dots of a compliant material such as silicone can be placed in a gap between the interposer and opening 88. The dots of compliant material can be used to retain the interposer 72 while allowing some Z-direction movement of the interposer 72.

The interposer 72 is maintained in a stationary position within the opening 88 by spring pressure exerted by the electrical connectors 78. However, during a test procedure the wafer 10 can be overdriven in the Z-direction with respect to the interconnect 22, to move the interconnect 22 and the interposer 72 in the Z-direction towards the electrical connectors 78. With the Z-direction overdrive, the contact force F (FIG. 6) with which the interconnect contacts 50 press into the die contacts 14 is generated by compression of the spring components of the electrical connectors 78.

The force F exerted by the electrical connectors 78 will be dependent on a spring constant, and amount of compression, of the spring components of the electrical connectors 78. A representative value for the force F can be from 0.10 oz to 1.5 oz per electrical connector 78. As used herein the term Z-direction overdrive refers to movement of the wafer 10 or probe card 20 towards one another past the initial point of contact between the interconnect contacts 50 and the die contacts 14. The Z-direction overdrive determines the amount of compression in the spring components of the electrical connectors 78 and thus the magnitude of the force F. A representative amount of Z-direction overdrive can be from 0.25 mils to 8 mils. Depending on the initial Z-direction location of the electrical connectors 78, the force F can include two components F1 and F2. F1 is the force applied by the electrical connectors 78 without overdrive. F2 is the force applied by the electrical connectors 78 from being deflected by the Z-direction overdrive distance.

As clearly shown in FIG. 4, the interposer support plate 74 also includes a leveling mechanism for leveling or planarizing the interposer 72 and interconnect 22 with respect to the wafer 10. Specifically, the leveling mechanism includes dowel pins 97 which accurately locate the interposer support plate 74 with respect to the base 76 of the probe card 20. In addition, threaded fasteners 94 attach the support plate 74 to the base 76. The base 76 includes threaded openings 96 for the threaded portions of the threaded fasteners 94. The interposer support plate 74 includes counterbored openings 98 for the head portions of the threaded fasteners 94. In addition, the threaded fasteners 94 are placed through stacks of one or more spring members in the form of belleview spring washers 95 located in counterbores in the base 76 to press against the interposer support plate 74.

As shown in FIG. 7, there are three threaded fasteners 94. As those skilled in the art will appreciate, by turning the threaded fasteners 94 by required amounts, the planarity of the interposer support plate 74 can be adjusted. This allows the interconnect 22 to be initially calibrated or leveled with respect to the wafer 10 prior to the test procedure. Such a calibration procedure will likely not need to be performed for each wafer being tested, but only after installation of the probe card 20 or during routine maintenance.

A representative amount of Z-direction travel for leveling the interposer support plate 74 can be from 5 mils to 20 mils. However, the spring force exerted by the belleview spring washers 95 is selected to be greater than the combined spring force exerted by all of the electrical connectors 78. The interposer support plate 74 thus remains stationary during a test procedure, while the interposer 72 and interconnect 22 are allowed to float in the Z-direction. Rather than belleview spring washers 95 the spring members can comprise compression springs or a compressible material such as a resilient elastomer.

As clearly shown in FIG. 4, the pin mounting plate 80 includes a plurality of through openings 100 wherein the electrical connectors 78 are mounted. Internal fasteners, a press fit, or an adhesive (not shown) can be used to secure the electrical connectors 78 to the openings 10. In addition, wires (not shown) electrically attach to the electrical connectors 78 held in the openings 100, to form the separate electrical paths 38 (FIG. 3) to the prober interface board 28 (FIG. 3).

The pin mounting plate 80 mounts to a corresponding opening 102 (FIG. 4) in the interposer support plate 74. In addition the pin mounting plate 80 includes a mounting flange 81 which is formed integrally therewith. Threaded fasteners 104 (FIG. 4) attach the mounting flange 81 and thus the pin mounting plate 80 to the base 76 of the probe card 20. In addition, dowel pins 108 (FIG. 7) can be used to maintain alignment of the pin mounting plate 80 and base 76. Threaded fasteners 106 (FIG. 4) attach the base 76 to the probe card substrate 40. In addition, dowel pins 110 (FIG. 7) can be used to maintain alignment of the base 76 and probe card substrate 40. The threaded fasteners and mounting arrangement for the probe card allow the probe card to be easily removed from the probe card fixture 46 (FIG. 3) for service or replacement.

The pin mounting plate 80, probe card base 76 and interposer support plate 74 are preferably fabricated of electrically insulating materials that can be machined or molded to the required tolerances. One suitable material is a machineable plastic such as polyether keton (PEK), PPS, PEEK, "DELRIN" or "TORLON". The pin mounting plate 80 can also be formed of a metal.

Referring to FIG. 9, broad steps in a test method for probe testing the semiconductor wafer 10 in accordance with the invention are illustrated.

Provide wafer handler 18 and tester 26 for applying test signals for testing semiconductor dice 12 contained on the wafer 10.

Provide probe card 20, for the wafer handler 18 including slidably mounted interconnect 22 and force applying member 42 with spring loaded electrical connectors. 78 for electrically contacting and biasing the interconnect 22 against the wafer 10.

Load the wafer 10 into the wafer handler 18.

Level the interconnect 22 with respect to the wafer 10 by adjusting the planar orientation of the interconnect 22. One method for leveling the interconnect 22 is with a calibration wafer. For example, the calibration wafer can include a blanket deposited aluminum layer. Impressions can be made by the die contacts in the layer. By evaluating outlines of the impressions, the planarity of the interconnect 22 with respect to the wafer 10 can be adjusted by turning the fasteners 94 as previously described.

Align die contacts 14 on the wafer 10 with interconnect contacts 50 by moving the wafer 10 or the probe card 20 in X and Y directions.

Move the wafer 10 or the probe card 20 in the Z-direction to place the die contacts 14 and the interconnect contacts 50 in physical contact.

Overdrive the wafer 10 or the probe card 20 in the Z-direction by a selected distance so that the interconnect contacts 50 penetrate the die contacts 14 under biasing from the spring loaded electrical connectors 78.

Compress the spring loaded electrical connectors 78 by the selected distance to exert a desired biasing force on the interconnect contacts 50 for penetrating the die contacts 14 to a limited penetration depth.

Transmit test signals through interconnect contacts 50 to die contacts 14.

Thus the invention provides a probe card for testing semiconductor wafers, and a test method and test system employing the probe card. The probe card is adapted to generate a biasing force for controlling a penetration depth into contacts on the wafer. In addition, the biasing force and electrical paths to the probe card are provided by spring loaded electrical connectors. Also, the probe card is adjustable for leveling the interconnect of the probe card with respect to the wafers. Still further a CTE of an interconnect component of the probe card can be matched to that of a silicon wafer, such that contacts on the interconnect move a same X–Y distance with temperature differentials, as the contacts on the wafer.

Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

We claim:

1. A test system for applying test signals to a semiconductor wafer comprising:
    a wafer handler configured to support the wafer;
    an interconnect on the wafer handler configured for movement in a direction and comprising a plurality of first contacts configured to electrically engage a plurality of second contacts on the wafer; and
    a plurality of electrical connectors on the wafer handler configured to transmit the test signals to the first contacts and configured for compression by movement of the interconnect to apply a biasing force to the interconnect during electrical engagement of the second contacts by the first contacts.

2. The test system of claim 1 wherein the wafer handler is configured to overdrive the wafer into the interconnect.

3. The test system of claim 1 wherein the electrical connectors comprise springs.

4. The test system of claim 1 further comprising an interposer on the wafer handler configured for mounting the interconnect for movement in the direction and for contacting the electrical connectors.

5. The test system of claim 1 wherein the first contacts comprise projections at least partially covered with conductive layers and configured to penetrate the second contacts.

6. The test system of claim 1 wherein the interconnect comprises a polymer film and the first contacts comprise microbumps on the polymer film.

7. The test system of claim 1 wherein the second contacts comprise bumps and the first contacts comprise indentations configured to retain the bumps.

8. A test system for testing a semiconductor wafer comprising:
    a tester for generating and analyzing test signals;
    a wafer handler comprising a wafer chuck configured to support the wafer for movement in a direction;
    an interconnect on the wafer handler comprising a plurality of first contacts configured to electrically engage a plurality of second contacts on the wafer, the interconnect mounted on the wafer handler for movement away from the wafer in the direction as the wafer is supported by the wafer chuck; and
    a plurality of spring loaded electrical connectors on the wafer handler in electrical communication with the tester and the first contacts and configured to apply a biasing force in the direction to the interconnect as the wafer is supported by the wafer chuck.

9. The test system of claim 8 further comprising an interposer configured to mount the interconnect to the wafer handler and comprising a plurality of external contacts in electrical communication with the first contacts and in physical contact with the spring loaded electrical connectors.

10. The test system of claim 9 wherein the external contacts comprise balls.

11. The test system of claim 9 wherein the external contacts comprise pads.

12. A test system for testing a semiconductor wafer comprising:

a wafer handler configured to support and move the wafer in a z-direction;

a probe card on the wafer handler comprising an interconnect configured to make temporary electrical connections with the wafer and movable in the z-direction, the interconnect comprising a plurality of first contacts configured to electrically engage a plurality of second contacts on the wafer; and a plurality of electrical connectors on the wafer handler in electrical communication with the first contacts configured to exert a biasing force on the interconnect as the wafer is overdriven in the z-direction into the interconnect.

13. The test system of claim 12 wherein each electrical connector comprises a spring.

14. The test system of claim 12 wherein each electrical connector comprises a spring, and the biasing force is dependent on a spring constant and a compression of the spring.

15. The test system of claim 12 wherein the first contacts comprise raised members configured to penetrate the second contacts.

16. The test system of claim 12 wherein the interconnect comprises a polymer film and the first contacts comprise microbumps on the polymer film.

17. The test system of claim 12 wherein the second contacts comprise bumps and the first contacts comprise indentations configured to retain the bumps.

18. A test system for testing a semiconductor wafer comprising:

a wafer handler;

a tester for generating and analyzing test signals; and a probe card on the wafer handler comprising an interconnect movable in a Z-direction comprising a plurality of first contacts configured to electrically engage a plurality of second contacts on the wafer, and a plurality of electrical connectors configured to transmit the test signals to the first contacts and to apply a biasing force in the Z-direction to the interconnect to press the interconnect and the wafer together.

19. The test system of claim 18 wherein the electrical connectors comprise springs and the wafer handler comprises a wafer chuck configured to move the wafer in the Z-direction into the interconnect to compress the springs.

20. The test system of claim 18 wherein each electrical connector comprises a tip portion and a spring configured to move the tip portion.

21. The test system of claim 18 further comprising an interposer attached to the interconnect and configured to mount the interconnect to the wafer handler for movement in the Z-direction.

* * * * *